United States Patent
Hatakeyama

(10) Patent No.: US 8,013,536 B2
(45) Date of Patent: Sep. 6, 2011

(54) INVERTER CIRCUIT

(75) Inventor: Takeshi Hatakeyama, Tokyo (JP)

(73) Assignee: Sumida Corporation, Tokyo (JP)

( * ) Notice: Subject to any disclaimer, the term of this patent is extended or adjusted under 35 U.S.C. 154(b) by 379 days.

(21) Appl. No.: 12/226,602

(22) PCT Filed: Apr. 20, 2007

(86) PCT No.: PCT/JP2007/058678
§ 371 (c)(1),
(2), (4) Date: Oct. 23, 2008

(87) PCT Pub. No.: WO2007/125839
PCT Pub. Date: Nov. 8, 2007

(65) Prior Publication Data
US 2009/0153072 A1 Jun. 18, 2009

(30) Foreign Application Priority Data

Apr. 25, 2006 (JP) .................. 2006-121148

(51) Int. Cl.
*H05B 37/00* (2006.01)
*H05B 39/00* (2006.01)
(52) U.S. Cl. .................. 315/276; 315/227 R
(58) Field of Classification Search .......... 315/276, 315/291, 307, 209 R; 310/166, 167
See application file for complete search history.

(56) References Cited

U.S. PATENT DOCUMENTS

| | | | |
|---|---|---|---|
| 6,252,782 B1 * | 6/2001 | Akashi et al. | 363/17 |
| 7,227,315 B2 * | 6/2007 | Shinbo et al. | 315/224 |
| 7,427,977 B2 * | 9/2008 | Park et al. | 345/102 |
| 7,557,488 B2 * | 7/2009 | Yamaguchi | 310/318 |
| 2005/0023988 A1 | 2/2005 | Komatsu et al. | |

FOREIGN PATENT DOCUMENTS

| | | |
|---|---|---|
| JP | U 58-63740 | 4/1983 |
| JP | U 59-180463 | 12/1984 |
| JP | A 8-181453 | 7/1996 |
| JP | A 11-186691 | 7/1999 |
| JP | A 2005-63941 | 3/2005 |
| JP | A 2005-322479 | 11/2005 |
| JP | 2006-082985 | * 3/2006 |

* cited by examiner

Primary Examiner — Douglas W Owens
Assistant Examiner — Minh D A
(74) Attorney, Agent, or Firm — Oliff & Berridge, PLC

(57) ABSTRACT

From the individual small areas of a conductor pattern arranged on the back side of a circuit board, there are individually extended leader patterns, which are midway led by through holes to the surface side of the circuit board. The individual leader patterns led to the surface side are connected with a terminal portion on the low-voltage side through jumper pads. The desired small areas are enabled to function by shorting the jumper pads with solder. The individual small areas are constituted to have a capacity of 1 pF, when caused to function, and they have such a capacity as a pattern capacitor as is proportional to the number of the shorted jumper pads.

7 Claims, 3 Drawing Sheets

[Figure 1]
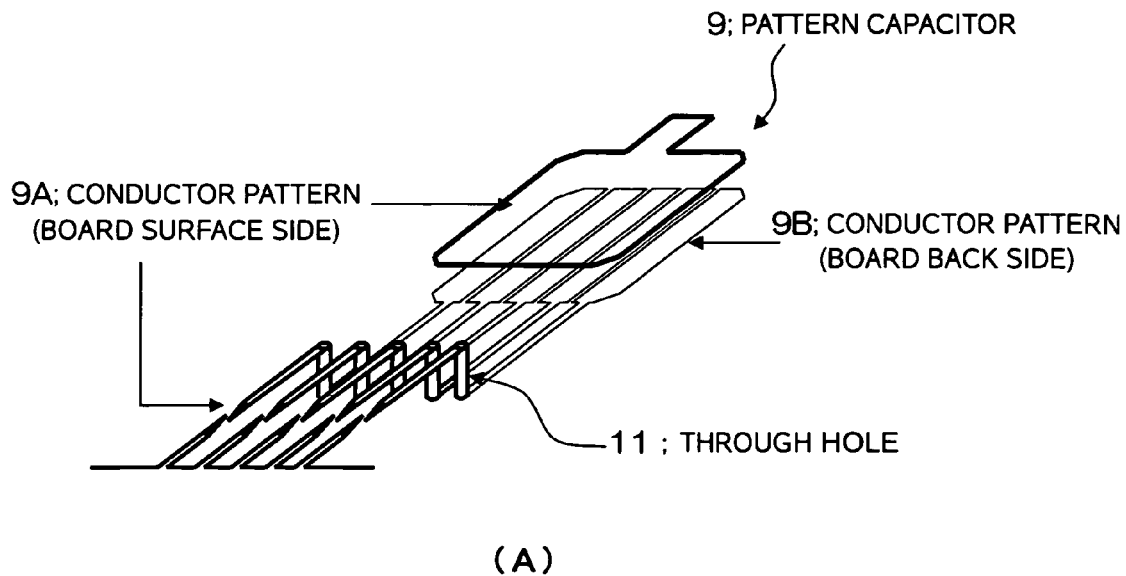
(A)
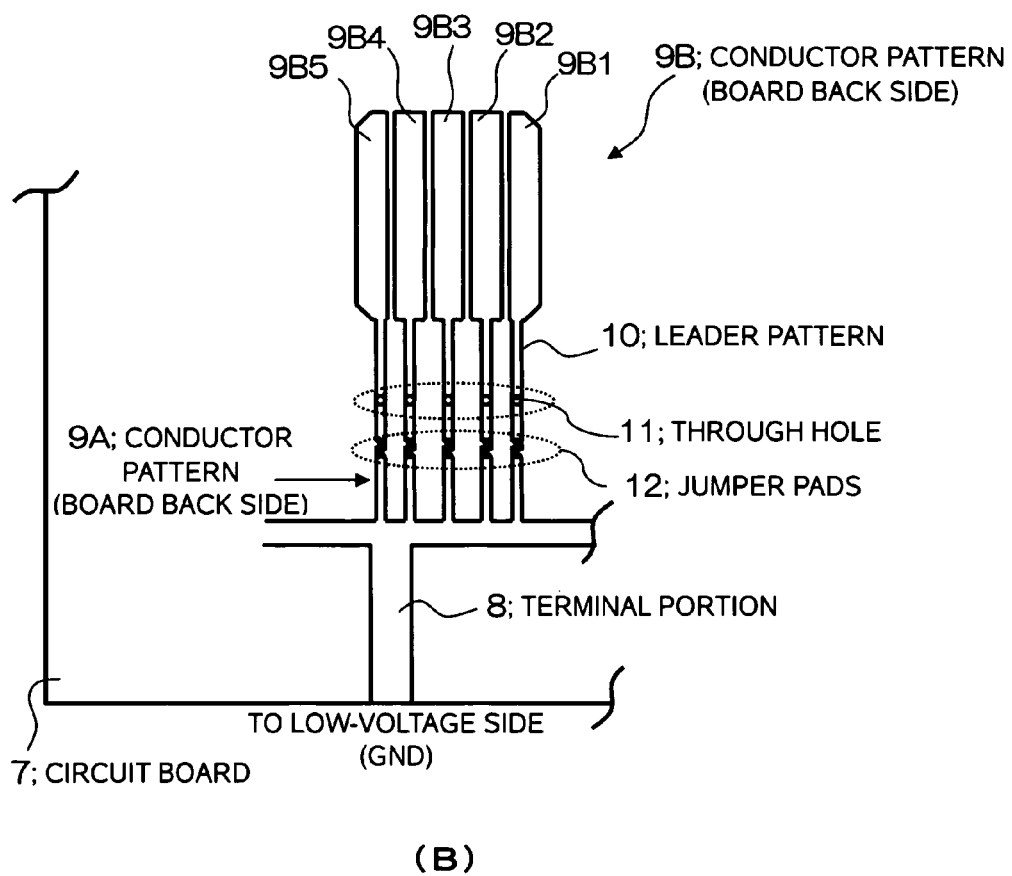
(B)

[Figure 2]
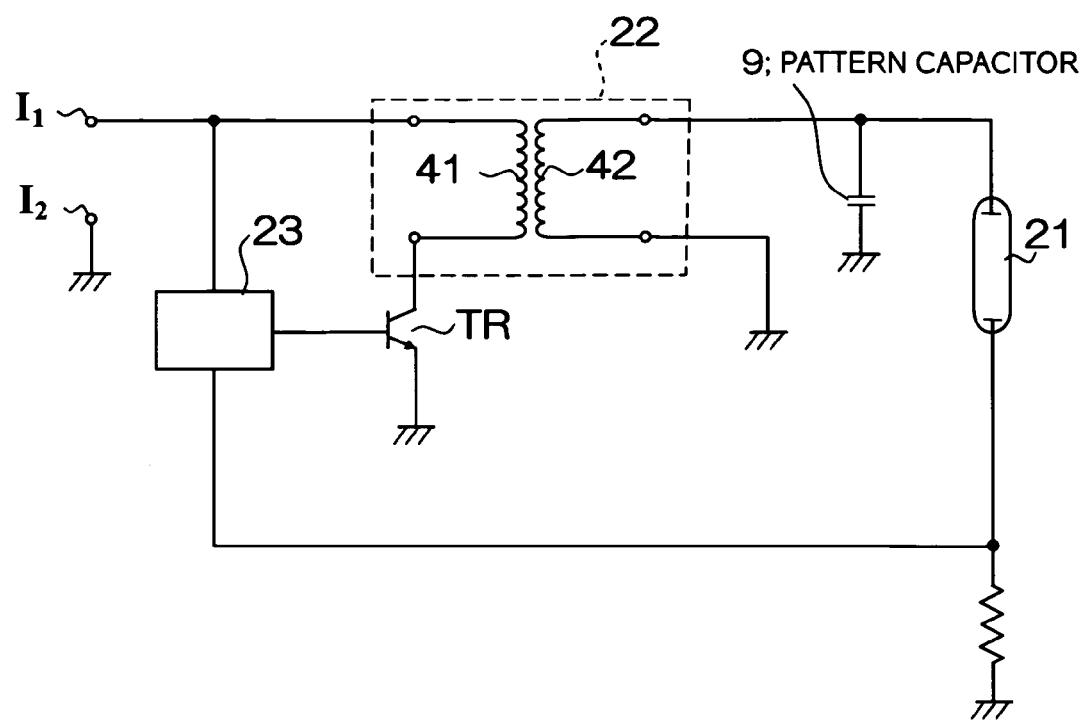

[Figure 3]
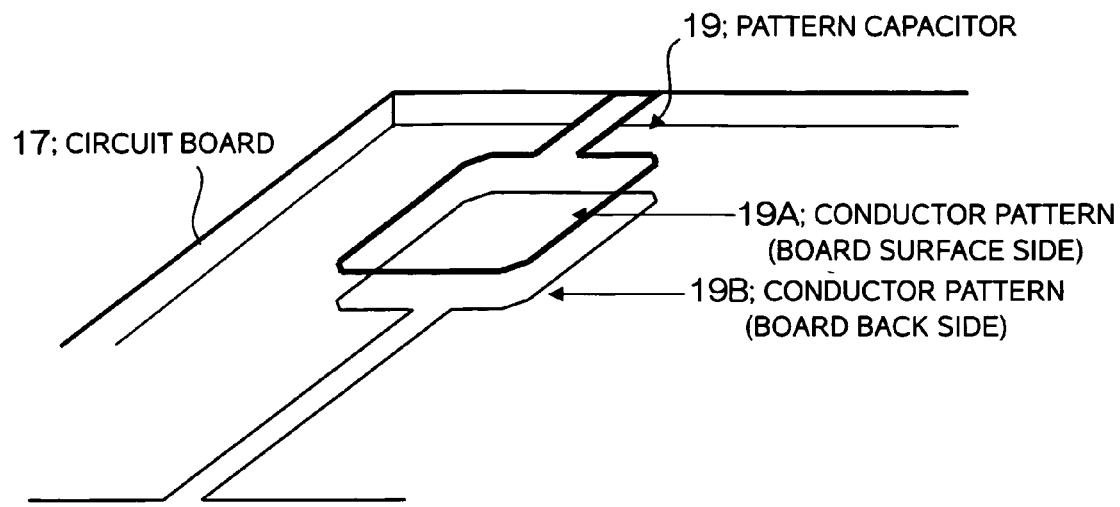
(A)
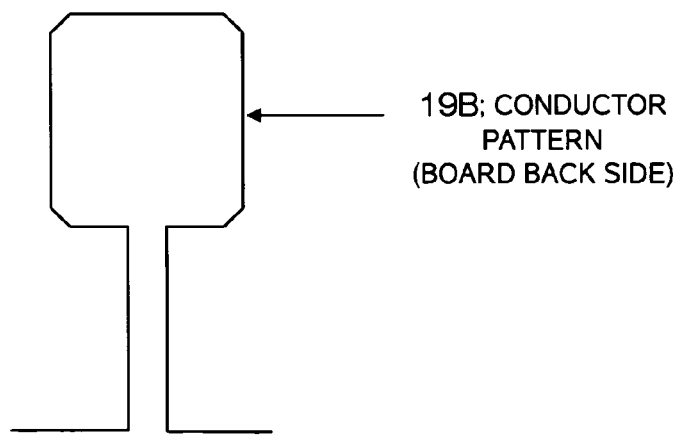
(B)

INVERTER CIRCUIT

TECHNICAL FIELD

The present invention relates to an inverter circuit which drives a discharge lamp, and particularly relates to an inverter circuit which performs inverter-drive of a discharge lamp for a backlight in a liquid crystal display panel.

BACKGROUND ART

In recent years, as inverter circuits which drive cold-cathode discharge lamps for backlights (hereinafter, simply called discharge lamps) of various kinds of liquid crystal display panels used in liquid crystal TVs, personal computer display surfaces and the like, various kinds of inverter circuits have been known (see, for example, Patent Document 1 described below).

Incidentally, in such an inverter circuit, a resonance frequency $f=1/(2\pi(LC)^{1/2})$ which is determined by a secondary side capacity component and an inductance component of the secondary winding of a transformer, which are connected to a discharge lamp in series, becomes an important factor that determines a tube current and efficiency when the inverter is driven. Specifically, for example, in order to drive the inverter circuit with high efficiency, the inverter circuit is preferably operated in the periphery of the resonance frequency, but for this purpose, adjustment of the inductance component of the transformer or the secondary side capacity component is required.

Conventionally, when such resonance frequency adjustment is performed by adjusting the value of the inductance component, the number of windings of the secondary winding of the transformer, for example, is changed. Meanwhile, when the resonance frequency adjustment is performed by adjusting the value of the secondary side capacity component, a capacitor is added to the secondary side high voltage line, for example.

Further, Patent Document 1 described below discloses the one in which the ballast capacitor connected to a discharge lamp is configured by a pattern capacitor. It is naturally possible to form the above described secondary side capacity component by the above described pattern capacitor, and when such a pattern capacitor is used, if the need for adjustment of the above described secondary side capacity component arises, design change of the board is performed in order to make the pattern once again.

Patent Document 1: Japanese Unexamined Patent Publication No. 2005-322479

DISCLOSURE OF THE INVENTION

Problems to Be Solved by the Invention

However, when the value of the inductance component is adjusted by changing the number of windings of the secondary winding of the transformer, the production speed sharply reduces due to change of the number of windings, and it is difficult to adopt this method actually in the mass production site.

Further, in the method in which the capacitor is added to the above described secondary side high voltage line, the operation requiring time and efforts becomes inevitable in order to prevent poor soldering between the capacitor terminal and the wiring pattern, and as a result, reduction in production speed is caused.

In this respect, in the case of changing the capacity component of the pattern capacitor, the problems in the above described two methods do not occur, but since the design of the circuit board is changed and produced once again each time the resonance frequency is changed, increase in manufacture cost is brought about, and it is difficult to respond to the demand for change in the resonance frequency quickly.

The present invention is made in view of the above described circumstances, and has an object to provide an inverter circuit which can avoid reduction in production efficiency and increase in manufacture cost accompanying remake of a board, and can quickly respond to demand for change in a resonance frequency.

Means for Solving the Problems

An inverter circuit of the present invention is an inverter circuit driving a discharge lamp, and is characterized in that
in a secondary side of a transformer of the inverter circuit,
an electrostatic capacity determining a resonance frequency relating to drive of the discharge lamp is formed by a pattern capacitor made of conductor patterns provided on opposed surfaces of a circuit board, and
out of the conductor patterns configuring the aforesaid pattern capacitor, any one of those on the surface and the back is divided into a plurality of areas.

Further, it is preferable that a leader pattern is provided to be added to each of the aforesaid plurality of areas, and
jumper pads with wiring patterns opposed with minute spaces therebetween are provided midway in the leader patterns.

Further, it is preferable that the aforesaid leader patterns are connected to a low voltage side through the aforesaid jumper pads.

Further, it is preferable that the aforesaid leader patterns are led from a side of any one of the surface and the back of the aforesaid board to the other side via through holes, and the aforesaid jumper pads are placed on a surface on a component mounting side.

Further, an inverter circuit of the present invention is an inverter circuit driving a discharge lamp, and is characterized by including
a pattern capacitor connected to one end side of a secondary winding of a transformer, and made of conductor patterns provided on opposed surfaces of a circuit board, and characterized in that
one of the conductor patterns of the pattern capacitor is divided into a plurality of areas, and an electrostatic capacity of the pattern capacitor is made variable depending on whether a jumper pad, which is connected to each of small areas of the conductor pattern which are divided into the plurality of areas, is shorted or not.

Effect of the Invention

In the inverter circuit of the present invention, in the secondary side of the transformer, the pattern capacitor on the circuit board is used as the capacitor for forming the capacity component, and out of the conductor patterns configuring the pattern capacitor, any one of those on the surface and the back is configured to be divided into a plurality of areas. By dividing the conductor pattern into a plurality of areas like this, the capacity components corresponding to the respective areas of the divided conductor pattern can be formed. By determining whether each of the divided areas is caused to function or not, it becomes possible to rapidly respond to the demand for change in the resonance frequency quickly while avoiding reduction in production speed and increase in the manufacture cost accompanying remake of the board.

Further, in order to determine whether each of the divided areas is caused to function or not, the leader patterns capable of being connected to the low voltage side are provided to be added, and the jumper pads with the wiring patterns opposed with the minute spaces therebetween are provided midway in the leader patterns, whereby increase and decrease of the capacity can be easily adjusted by determining whether the space is filled with solder or not for each of the slits of the jumper pads.

BRIEF DESCRIPTION OF THE DRAWINGS

FIG. 1 is a schematic view showing the configuration of a pattern capacitor of an inverter circuit according to an embodiment of the present invention;

FIG. 2 is a diagram showing the schematic configuration of the inverter circuit according to the embodiment of the present invention; and FIG. 3 is a schematic view showing the configuration of a conventional pattern capacitor.

DESCRIPTION OF SYMBOLS 7, 17 CIRCUIT BOARD
8 TERMINAL PORTION
9, 19 PATTERN CAPACITOR
9A, 19A CONDUCTOR PATTERN (BOARD SURFACE SIDE)
9B, 19B CONDUCTOR PATTERN (BOARD BACK SIDE)
9B1, 9B2, 9B3, 9B4, 9B5 SMALL AREA
10 LEADER PATTERN
11 THROUGH HOLE
12 JUMPER PAD
21 DISCHARGE LAMP
22 BOOSTER TRANSFORMER
23 DRIVING IC
41 PRIMARY WINDING
42 SECONDARY WINDING
TR TRANSISTOR

BEST MODE FOR CARRYING OUT THE INVENTION

Hereinafter, an embodiment of the present invention will be described with reference to the accompanying drawings.

An inverter circuit of the present invention is a discharge lamp drive circuit mounted with an inverter transformer for discharging and lighting a discharge lamp (cold-cathode fluorescent lamp: CCFL).

The main part of this inverter circuit is mounted on a circuit board, and is configured so that one end side of the secondary side of a transformer is connected to one end portion of the discharge lamp, and a predetermined terminal for a controlling IC is connected to the other end portion of the discharge lamp. More specifically, the circuit configuration as shown in FIG. 2, for example, is adopted.

Specifically, the drive circuit drives a discharge lamp 21 by using a booster transformer 22, a transistor TR and a driving IC 23.

In the inverter circuit, a DC voltage is applied between input terminals $I_1$ and $I_2$, a high voltage is generated at both ends of a secondary winding 42 of the booster transformer 22 by using a switching operation of the transistor TR based on the voltage applied to both ends of a primary winding 41 of the booster transformer 22, and by the high voltage, the discharge lamp 21 is driven and lighted. In such an inverter circuit, at the end portion of the high voltage side of the secondary winding 42 of the booster transformer 22, a capacity component is added in parallel with the discharge lamp 21, and in the inverter circuit of the present invention, the capacity component is formed by a pattern capacitor 9.

The pattern capacitor 9 has the function of determining the resonance frequency of the discharge lamp, and is formed by a part of a circuit board 7.

Specifically, as shown in FIG. 1, conductor patterns 9A and 9B which function as electrodes are provided in the opposed positions on the surface and the back of the circuit board 7 to function as the pattern capacitor 9 with a dielectric layer (insulating board) interposed between the conductor patterns. Here, the conductor pattern 9A which is located on the surface side is entirely in a conductive state, and is connected to the high voltage side. Meanwhile, the conductor pattern 9B located on the back side is divided into small areas 9B1 to 9B5 constituted of about equivalent areas by slits (slim areas with no patterns formed), and each of the small areas 9B1 to 9B5 is able to be connected to the low voltage side of the transformer (or ground GND) via each of leader patterns 10.

Here, an electrostatic capacity C of a capacitor is generally expressed by the following formula (1).

$$C = \epsilon \times S / d \quad (1)$$

Here,
$\epsilon$: dielectric constant
S: electrode area
d: distance between electrodes Here, the capacity C of an ordinary pattern capacitor 19 as shown in FIG. 3 is proportional to an area S of the opposed areas of conductor patterns 19A and 19B, and is inversely proportional to a distance d of the conductor patterns 19A and 19B. Here, the distance d of the conductor patterns 19A and 19B corresponds to the thickness of a circuit board 17, and the thickness is constant. Meanwhile, an area S of the opposed areas of the conductor patterns 19A and 19B is also constant, and as a result, the capacity C of the pattern capacitor 19 is always constant. This cannot respond to the situation in which the resonance frequency is desired to be changed or the like, and is inconvenient.

Thus, in the pattern capacitor 9 of the inverter circuit of the present embodiment, as shown in FIG. 1, the conductor pattern 9B which is located on the back side is divided into, for example, the five small areas 9B1 to 9B5, and thereby, the capacity C is made variable. Specifically, the area S which is a factor for determining the above described capacity C is the area for the areas which actually function, and therefore, the value of the above described capacitor C ultimately depends on how many small areas out of the small areas 9B1 to 9B5 are caused to function. Specifically, when comparing the case of causing, for example, one small area to function out of the five small areas 9B1 to 9B5, and the case of causing the five small areas to function, the latter has the capacity five times as large as that of the former if the respective small areas are assumed to have the areas substantially equivalent to one another.

Here, "the small areas 9B1 to 9B5 are caused to function" means that the small areas 9B1 to 9B5 are electrically connected to the low voltage side (or GND) and caused to generate capacity components. Specifically, the respective leader patterns 10 extend from the respective small areas 9B1 to 9B5 of the conductor pattern 9B disposed on the back side of the circuit board 7, and the respective leader patterns 10 are midway led to the surface side of the circuit board 7 by through holes 11. The respective leader patterns 10 which are led to the surface side are connected to a terminal portion 8 on the low voltage side (or GND) through jumper pads 12.

Here, the jumper pad means the pattern provided with a slit capable of opening and shorting by providing solder, and patterns on both sides of the jumper pad are conducted by applying melted solder to the slit portion.

Accordingly, by shorting the jumper pads 12 with the solder, the desired small areas 9B1 to 9B5 can be caused to function.

Each of the small areas 9B1 to 9B5 is configured to have a capacity of, for example, 1 pF when it is caused to function.

Further, leading the above described leader patterns 10 to the surface side from the back side of the circuit board 7 by the through holes 11 is on the assumption that when soldering is applied, the back side is located along the working stand and soldering is performed for the jumper pads 12 located on the surface side, because the components (components configuring the inverter circuit, such as a power supply part, control part and a transformer part) mounted to the circuit board 7 are gathered on the surface side, and the back side is in the flat state.

Further, the reason why the above described respective small areas 9B1 to 9B5 are provided on the pattern on the low voltage side is that providing them on the pattern on the low voltage side is excellent in insulating performance, potential stability and safety as compared with the case in which they are provided on the pattern on the high voltage side.

The inverter circuit of the present invention is not limited to the inverter circuit of the above described embodiment, and various modifications can be made. For example, in the inverter circuit of the above described embodiment, in the conductor pattern divided into a plurality of areas, the electrostatic capacity of the capacitor is configured to increase each time the soldering operation for the jumper pad is performed, but contrary to this, all of the plurality of areas may be configured to function at first, and thereafter, the electrostatic capacity of the capacitor may be configured to decrease each time the treatment such as a soldering operation is applied. In this case, the opposed wiring patterns of the respective jumper pads, for example, are configured to be connected through resistance elements, and by removing the suitable number of resistance elements in accordance with necessity, the electrostatic capacity of the capacitor can be made a desired one.

Further, the shapes of the divided small areas of the conductor pattern are not limited to the shapes of the above described embodiment, and a substantially square conductor pattern may be divided by a plurality of slits arranged obliquely with respect to the respective sides.

Further, the respective small areas do not always have to have the same areas. For example, as the capacities (areas) of the respective five divided small areas, the areas each with 1 pF, 2 pF, 3 pF, 4 pF and 5 pF are provided, and depending on which small area is caused to function, any integer value of 1 pF to 15 pF may be made settable.

Further, the shape of the above described jumper pad is not limited to the shape of the above described embodiment, and various shapes can be adopted.

Further, in the above described embodiment, the conductor pattern which is disposed on the back side of the circuit board is divided into a plurality of areas, but the conductor pattern which is disposed on the surface side of the circuit board may be divided into a plurality of areas.

Further, the leader patterns from the conductor pattern do not always have to be configured to be led from one surface side of the circuit board to the other surface side.

Further, in the above described embodiment, the inverter circuit shown in FIG. 2 is described, but the configuration of the circuit can be changed in any way if only the circuit can drive a discharge lamp.

Further, the basic idea of the inverter circuit of the present invention can be applied to various kinds of circuits using capacitors in a switching power supply, a DC-DC converter and the like.

The invention claimed is:

1. An inverter circuit driving a discharge lamp comprising:
    a pattern capacitor connected to one end side of a secondary winding of a transformer, and made of conductor patterns provided on opposed surfaces of a circuit board, wherein:
        one of said conductor patterns of said pattern capacitor is divided into a plurality of small areas which are connected to a respective one of a plurality of jumper pads, and
        an electrostatic capacity of said pattern capacitor is made variable depending on whether each of the jumper pads is shorted or not, wherein a leader pattern is provided to connect to each of said plurality of small areas, and said jumper pads opposed with minute spaces therebetween are provided midway in said leader patterns.

2. The inverter circuits according to claim 1, wherein said leader patterns are connected to a low voltage side through said jumper pads.

3. The inverter circuit according to claim 2, wherein said leader patterns are led from a front surface or a back surface of said circuit board to the other of the front surface or the back surface via through holes, and
    said jumper pads are placed on a surface on a component mounting side.

4. The inverter circuit according to claim 1, wherein
    said leader patterns are led from a front surface or a back surface of said circuit board to the other of the front surface or the back surface via through holes, and
    said jumper pads are placed on the front surface, the front surface defined on a component mounting surface of the circuit board.

5. The inverter circuit according to claim 1, wherein each of the small areas is of about equivalent size.

6. An inverter circuit driving a discharge lamp, wherein
    in a secondary side of a transformer of said inverter circuit, an electrostatic capacity component determining a resonance frequency relating to drive of said discharge lamp is formed by a pattern capacitor made of conductor patterns provided on opposed surfaces of a circuit board, and
    one of said conductor patterns configuring said pattern capacitor, any one of said conductor patterns on one of a front surface and a back surface of the circuit board is divided into a plurality of small areas, wherein a leader pattern is provided to connect to each of said plurality of small areas, and said jumper pads opposed with minute spaces there-between are provided midway in said leader patterns.

7. The inverter circuit according to claim 6, wherein each of the small areas is of about equivalent size.

* * * * *